(12) United States Patent  
Chen et al.

(10) Patent No.: US 9,240,228 B1  
(45) Date of Patent: Jan. 19, 2016

(54) STATIC MEMORY APPARATUS AND DATA READING METHOD THEREOF

(71) Applicant: Faraday Technology Corp., Hsin-Chu (TW)

(72) Inventors: Biao Chen, Suzhou (CN); Zhao-Yong Zhang, Suzhou (CN); Hao Wu, Suzhou (CN); Kun-Ti Lee, Kinmen County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/457,125

(22) Filed: Aug. 12, 2014

(30) Foreign Application Priority Data

Jul. 14, 2014 (CN) .......................... 2014 1 0333266

(51) Int. Cl.  
*G11C 7/04* (2006.01)  
*G11C 7/12* (2006.01)  
*G11C 7/06* (2006.01)

(52) U.S. Cl.  
CPC ... *G11C 7/12* (2013.01); *G11C 7/06* (2013.01)

(58) Field of Classification Search  
CPC . G11C 7/08; G11C 11/419; G11C 2211/5634

USPC .......... 365/156, 154, 210.11, 210.12, 210.14, 365/210.15, 211  
See application file for complete search history.

(56) References Cited

U.S. PATENT DOCUMENTS

| | | | | |
|---|---|---|---|---|
| 7,050,348 B2 * | 5/2006 | Frey | .......................... | G11C 7/06 365/204 |
| 7,324,393 B2 * | 1/2008 | Chan | ...................... | G11C 7/062 365/185.21 |
| 7,907,462 B2 * | 3/2011 | Byeon | .................... | G11C 5/147 327/512 |

* cited by examiner

*Primary Examiner* — Andrew Q Tran  
(74) *Attorney, Agent, or Firm* — Winston Hsu; Scott Margo (57) ABSTRACT

A static memory apparatus and a data reading method thereof are provided. The static memory apparatus includes a plurality of memory cells, a plurality of dummy memory cells, a sense amplifier, and a discharge current adjuster. The dummy memory cells respectively include a plurality discharge ends for discharging charges on a dummy bit line. The sense amplifier is enabled for a sensing and amplifying operation according to a signal on the dummy bit line, and the sense amplifier generates readout data accordingly. The discharge current adjuster adjusts at least one discharge current on at least one controlled discharge end according to an operating voltage of the memory cells.

15 Claims, 8 Drawing Sheets

STATIC MEMORY APPARATUS AND DATA READING METHOD THEREOF

CROSS-REFERENCE TO RELATED APPLICATION

This application claims the priority benefit of China application serial no. 201410333266.8, filed on Jul. 14, 2014. The entirety of the above-mentioned patent application is hereby incorporated by reference herein and made a part of this specification.

BACKGROUND OF THE INVENTION

1. Field of the Invention

The invention relates to a static memory apparatus and more particularly relates to a data reading method of the static memory apparatus.

2. Description of Related Art

Figure 1:
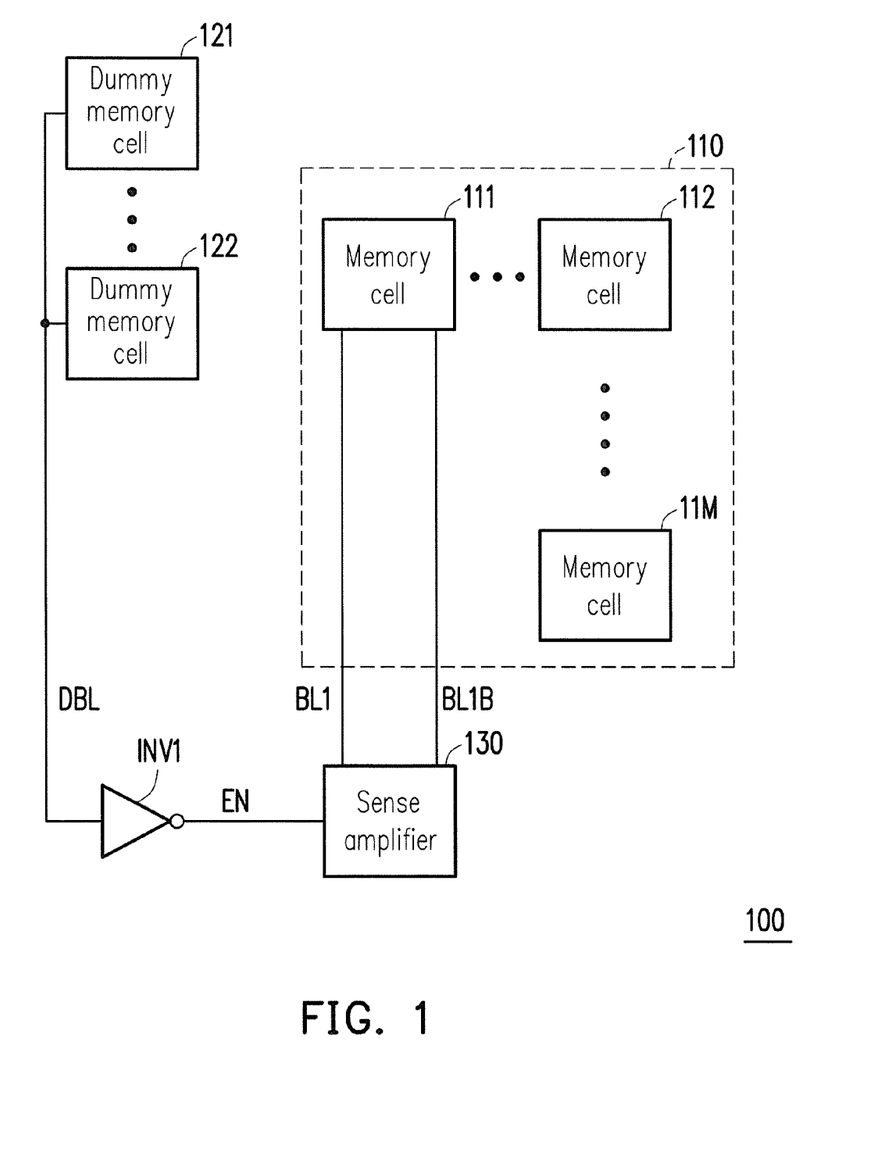
FIG. 1 is a block diagram of a conventional static memory apparatus.

Referring to FIG. 1, FIG. 1 is a block diagram of a conventional static memory apparatus. A static memory apparatus 100 is a static random access memory apparatus, which includes a plurality of memory cells 111-11M, a plurality of dummy memory cells 121-122, and a sense amplifier 130. The memory cells 111-11M form a memory array 110 and are coupled to the sense amplifier 130 via bit lines BL1 and BL1B. A dummy bit line DBL coupled to the dummy memory cells 121-122 is connected with an input end of an inverter INV1, and an output end of the inverter INV1 is coupled to the sense amplifier 130 and provides an enable signal EN for enabling a sensing and amplifying operation of the sense amplifier 130.

When the static memory apparatus 100 executes a data reading operation, a voltage level of a signal transmitted by the dummy bit line DBL is lowered correspondingly, and the sensing and amplifying operation of the sense amplifier 130 is enabled by the enable signal EN that is raised correspondingly. Meanwhile, the sense amplifier 130 senses and amplifies a difference between signals on the bit lines BL1 and BL1B, so as to obtain readout data.

However, when a process mismatch occurs on the static memory apparatus 100, a speed of change of the signal transmitted by the dummy bit line DBL may become far faster than a speed of change of the signals on the bit lines BL1 and BL1B. As a result, when the sense amplifier 130 is enabled, correct readout data cannot be obtained because the difference between the signals on the bit lines BL1 and the BL1B is smaller than an offset voltage of the sense amplifier. The above situation becomes worse when the static memory apparatus 100 receives an operating voltage of a lower voltage value.

SUMMARY OF THE INVENTION

The invention provides a static memory apparatus and a data reading method thereof for effectively reducing data reading errors.

The static memory apparatus of the invention includes a plurality of memory cells, a plurality of dummy memory cells, a sense amplifier, and a discharge current adjuster. The memory cells are arranged in a memory array that is coupled to a plurality of bit lines. The dummy memory cells are coupled to a dummy bit line and respectively include a plurality of discharge ends for discharging charges on the dummy bit line. The sense amplifier is coupled to the bit lines and the dummy bit line and performs a sensing and amplifying operation on signals on the bit lines according to a signal on the dummy bit line, so as to generate readout data. The discharge current adjuster is coupled to at least one controlled discharge end of the discharge ends and adjusts a discharge current on the at least one controlled discharge end according to an operating voltage received by the memory cells.

The invention provides a data reading method of a static memory apparatus, wherein the static memory apparatus includes a plurality of dummy memory cells, and the dummy memory cells respectively include a plurality of discharge ends. The data reading method includes: adjusting a discharge current on at least one controlled discharge end of the discharge ends when the static memory apparatus performs a data reading operation, wherein the discharge ends discharge charges on a dummy bit line. A signal on the dummy bit line is provided to enable a sense amplifier to perform a sensing and amplifying operation on signals on a plurality of bit lines, so as to generate readout data.

Based on the above, when performing the data reading operation, the invention adjusts the discharge current which is discharged from the dummy bit line by the discharge ends in one or multiple dummy memory cells according to the operating voltage, and thereby delays the signal on the dummy bit line. Therefore, a time point that the sense amplifier is enabled is adjusted properly in accordance with the operating voltage, so as to effectively prevent data reading errors that occur because the sense amplifier is enabled too early due to overly low operating voltage, thereby maintaining a proper operation of the static memory apparatus.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 2:
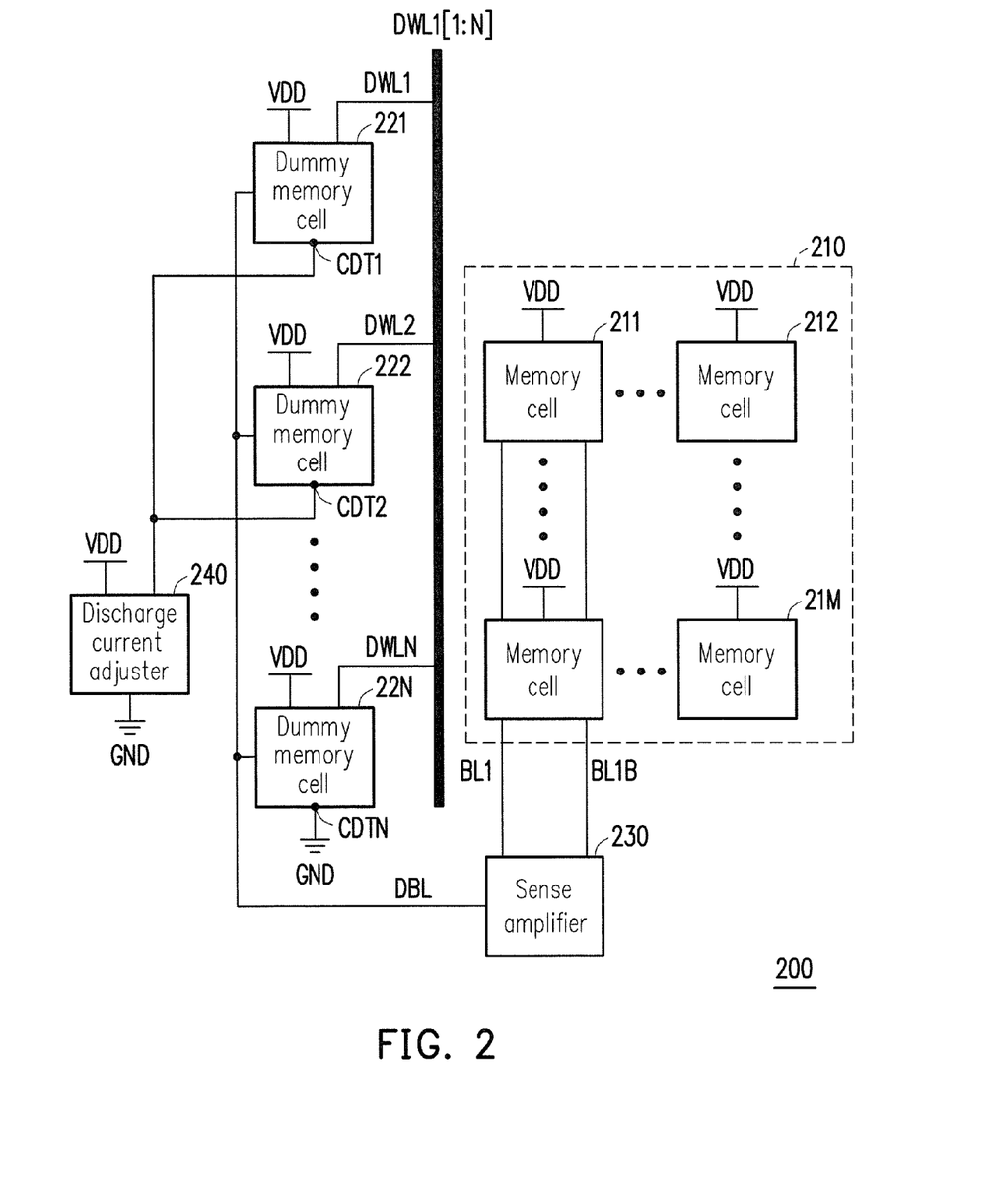
FIG. 2 is a schematic diagram of a static memory apparatus according to an embodiment of the invention.

Referring to FIG. 2, FIG. 2 is a schematic diagram of a static memory apparatus according to an embodiment of the invention. A static memory apparatus 200 includes a plurality of memory cells 211-21M, a plurality of dummy memory cells 221-22N, a sense amplifier 230, and a discharge current adjuster 240. The memory cells 211-21M are arranged in a memory array 210, and the memory cells 211-21M are memory cells of a static random access memory. In addition, the memory array 210 is coupled to a plurality of bit lines BL1 and BL1B. The dummy memory cells 221-22N are coupled to a dummy bit line DBL and the dummy bit line DBL is coupled to the sense amplifier 230. The sense amplifier 230 is further coupled to the bit lines BL1 and BL1B and enabled to perform a sensing and amplifying operation on signals on the bit lines BL1 and BL1B according to a signal on the dummy bit line DBL, so as to obtain readout data.

Furthermore, the dummy memory cells 221-22N respectively include discharge ends CDT1-CDTN. The discharge ends CDT1-CDTN cause the signal on the dummy bit line DBL to perform a discharging operation respectively via circuits in the dummy memory cells 221-22N. At least one or multiple controlled discharge ends of the discharge ends CDT1-CDTN (in this embodiment, the controlled discharge ends are discharge ends CDT1 and CDT2) are coupled to the discharge current adjuster 240, and the discharge current adjuster 240 adjusts a discharge current generated between the controlled discharge ends (the discharge ends CDT1 and CDT2) and a reference ground voltage GND.

The discharge end not coupled to the discharge current adjuster 240 (e.g. the discharge end CDTN) is directly coupled to the reference ground voltage GND.

Regarding details of the operation, when the static memory apparatus 200 executes a data reading operation, the dummy memory cells 221-22N cause the discharging operation between the dummy bit line DBL and the discharge ends CDT1-CDTN to begin respectively according to dummy word line signals DWL1-DWLN received. Meanwhile, the discharge current adjuster 240 turns on a discharge current adjusting mechanism between the discharge ends CDT1 and CDT2 and the reference ground voltage GND. When the static memory apparatus 200 receives an operating voltage having a lower voltage value, a current value of the discharge current provided by the discharge current adjuster 240 is smaller than a current value of the discharge current that the discharge end CDTN directly discharges the reference ground voltage GND.

What is important is that the static memory apparatus 200 provides the corresponding discharge current of the discharge current adjuster 240 according to the operating voltage VDD received by the dummy memory cells 221-22N and the memory cells 211-21M and a process temperature variation. More specifically, when the voltage value of the operating voltage VDD gets lower, the current value of the discharge current provided by the discharge current adjuster 240 becomes lower, and the current value of the discharge current is determined according to the discharge current of the weakest memory cell of the memory cells 211-21M.

Further to the above, by lowering the current value of the discharge current between the discharge ends CDT1 and CDT2 and the reference ground voltage GND, a speed that a voltage level of the signal on the dummy bit line DBL is pulled down is reduced. As a result, an enabling time point for determining whether to enable the sense amplifier 230 according to the signal on the dummy bit line DBL is delayed. In other words, the sense amplifier 230 can be enabled at a time point when the difference between the voltage levels of the signals on a pair of bit lines coupled to the weakest memory cell can be accurately sensed, so as to obtain the readout data accurately.

In an embodiment of the invention, the discharge current adjuster 240 divides the operating voltage VDD and adjusts the current value of the discharge current according to a division result thereof. Accordingly, the time point of enabling the sense amplifier 230 can be adjusted properly according to the operating voltage VDD, so as to effectively prevent data reading errors caused by change of the operating voltage VDD.

Figure 3A:
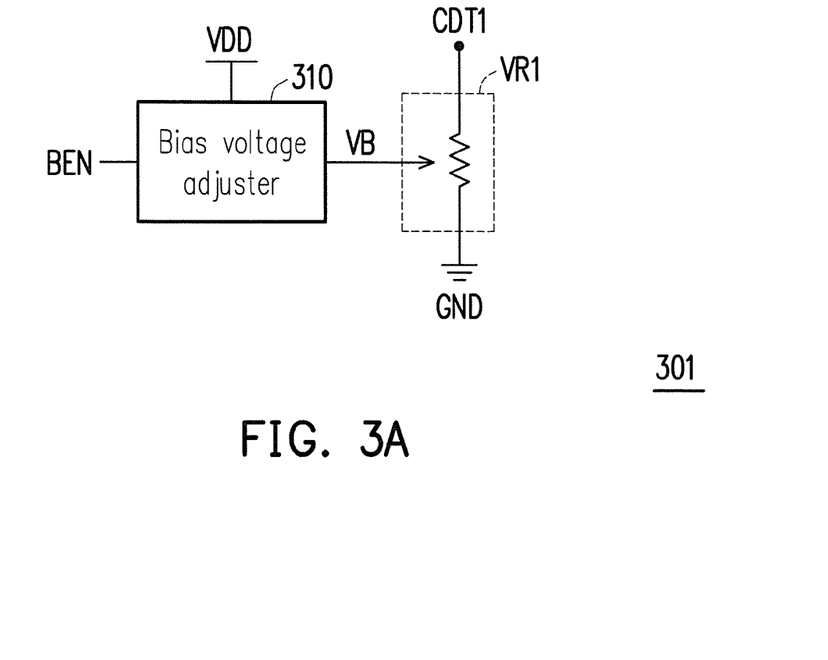
FIG. 3A and FIG. 3B are schematic diagrams illustrating different implementations of a discharge current adjuster according to embodiments of the invention.
Figure 3B:
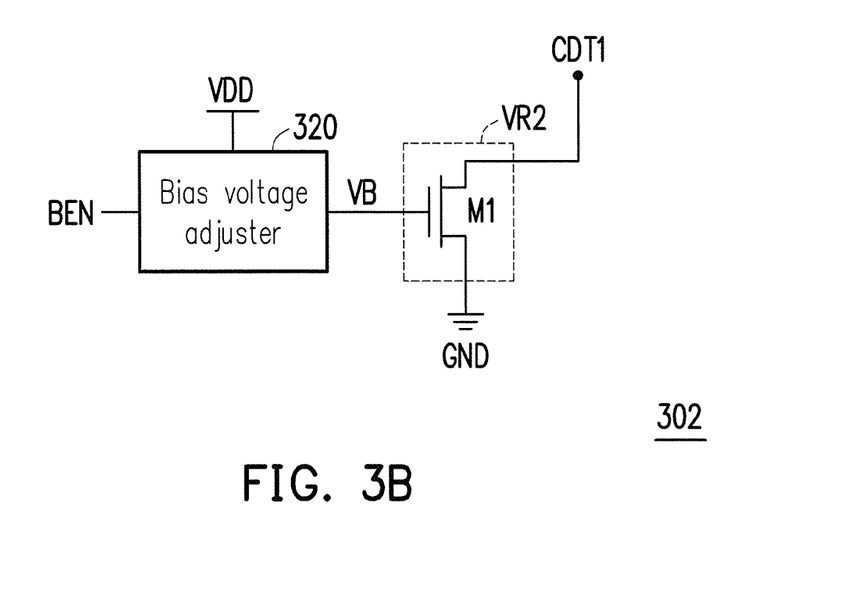

Referring to FIG. 3A and FIG. 3B, FIG. 3A and FIG. 3B are schematic diagrams illustrating different implementations of the discharge current adjuster according to embodiments of the invention. In FIG. 3A, a discharge current adjuster 301 includes a bias voltage adjuster 310 and a variable resistor VR1. The bias voltage adjuster 310 provides a bias voltage VB and transmits the bias voltage VB to the variable resistor VR1. The variable resistor VR1 adjusts a resistance value thereof according to the bias voltage VB. In terms of operation, when the static memory apparatus does not perform the data reading operation, the bias voltage VB can be equal to the operating voltage VDD. In contrast, when the static memory apparatus performs the data reading operation, the bias voltage adjuster 310 enables an adjusting operation of the bias voltage VB according to a bias voltage adjusting signal BEN, and the bias voltage adjuster 310 divides the operating voltage VDD to lower the voltage value of the bias voltage VB. Correspondingly, the variable resistor VR1 raises the resistance value thereof according to the lowered bias voltage VB and thereby lowers the discharge current value between the discharge end CDT1 and the reference ground voltage GND.

It should also be noted that, when the bias voltage VB is equal to the operating voltage VDD, the resistance value of the variable resistor VR1 is nearly equal to 0.

In FIG. 3B, a discharge current adjuster 302 includes a bias voltage adjuster 320 and a variable resistor VR2. Unlike FIG. 3A, the variable resistor VR2 is formed by a transistor M1, wherein a first end (e.g. a source) and a second end (e.g. a drain) of the transistor M1 are connected in series between the discharge end CDT1 and the reference ground voltage GND, and a control end (e.g. a gate) of the transistor M1 receives the bias voltage VB. In addition, in this embodiment, the transistor M1 is an N type transistor.

Figure 4:
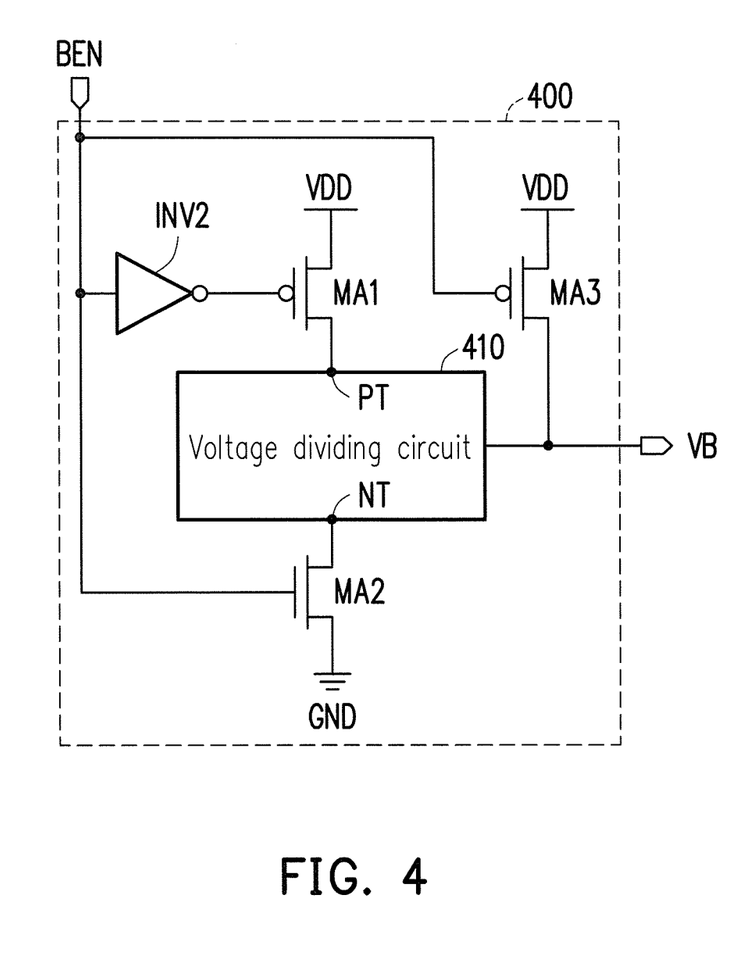
FIG. 4 is a schematic diagram of a bias voltage adjuster according to an embodiment of the invention.

Referring to FIG. 4, FIG. 4 is a schematic diagram of a bias voltage adjuster according to an embodiment of the invention. A bias voltage adjuster 400 includes a voltage dividing circuit 410, transistors MA1-MA3, and an inverter INV2. The transistors MA1 and MA2 respectively serve as switches, wherein the transistor MA1 is coupled to a path of an end PT of the voltage dividing circuit 410 receiving the operating voltage VDD, and the transistor MA2 is coupled to a path of an end NT of the voltage dividing circuit 410 receiving the reference ground voltage GND. An input end of the inverter INV2 receives the bias voltage adjusting signal BEN, and an output end of the inverter INV2 generates an inverted bias voltage adjusting signal to control a turn-on or turn-off operation of the transistor MA1. Moreover, a turn-on or turn-off operation of the transistor MA2 is determined by the bias voltage adjusting signal BEN.

The transistor MA3 is a pull-up circuit and receives the bias voltage adjusting signal BEN to determine whether to be turned on, and when the transistor MA3 is turned on, the bias voltage VB is pulled up to be equal to the operating voltage VDD.

In terms of the operation of the bias voltage adjuster 400, when no data reading is performed, the transistors MA1 and MA2 can be turned off to cause the voltage dividing circuit 410 to perform no operation. The transistor MA3 is turned on to cause the bias voltage VB to be pulled up to be equal to the operating voltage VDD. On the other hand, when data reading is performed, the transistors MA1 and MA2 are turned on to cause the voltage dividing circuit 410 to work, and the transistor MA3 is turned on. At this moment, the voltage value of the bias voltage VB is determined by the voltage dividing circuit 410 and is lowered accordingly.

Figure 5A:
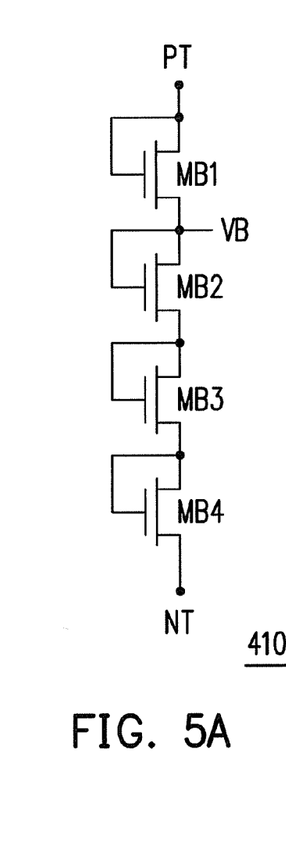
FIG. 5A to FIG. 5D are schematic diagrams illustrating a voltage dividing circuit according to an embodiment of the invention.
Figure 5B:
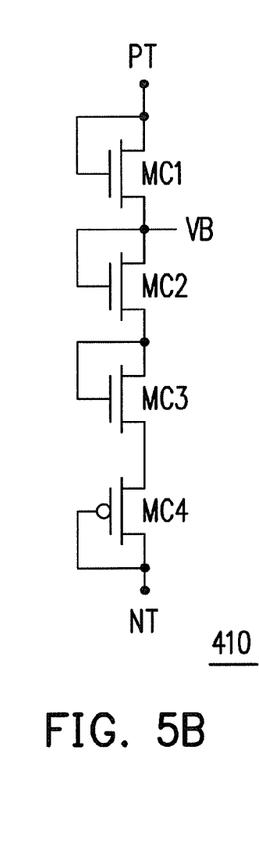
Figure 5C:
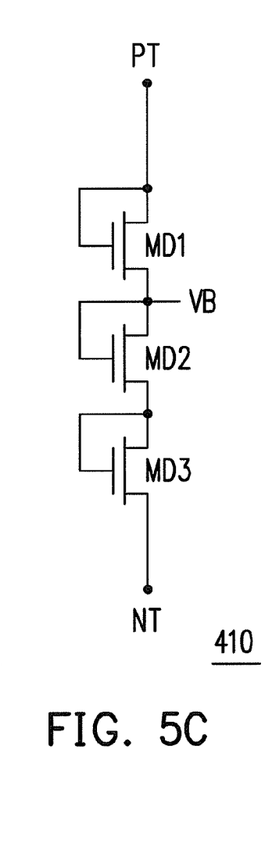

Regarding implementation of the voltage dividing circuit, FIG. 5A to FIG. 5D are schematic diagrams illustrating the voltage dividing circuit according to an embodiment of the invention. In FIG. 5A, the voltage dividing circuit 410 is formed by a plurality of transistors MB1-MB4, wherein the transistors MB1-MB4 are connected to form a configuration of a diode and are sequentially connected in series between the ends PT and NT in a direction of a forward bias. An end connecting the transistors MB1 and MB2 generates the bias voltage VB. The transistors MB1-MB4 may all be N type transistors, and under the condition that the transistors MB1-MB4 have the same characteristics, the bias voltage VB can be ¾ times the operating voltage VDD.

Certainly, the end that generates the bias voltage VB may be varied according to the design requirement. For example, the end may be an end where the transistors MB2 and MB3 are connected, or an end where the transistors MB3 and MB4 are connected. The number of the transistors that form the diode may also be varied and is not limited to 4. Take the embodiment of FIG. 5C for example, the voltage dividing circuit 410 is formed by three transistors MD1-MD3.

It should be noted that the bias voltage VB generated by the voltage dividing circuit 410 is determined by the characteristics of multiple transistors. When a process voltage temperature (PVT) varies, the bias voltage VB generated by the voltage dividing circuit 410 is compensated and an unexpected change does not occur. In addition, by the method of the embodiment of the invention, the current consumed by the voltage dividing circuit 410 can be reduced effectively for power saving.

Figure 5D:
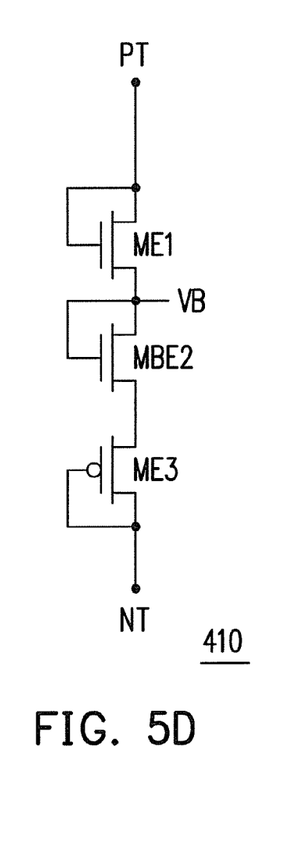

Moreover, in the voltage dividing circuit 410, the transistors may have different configurations. For example, in FIG. 5B, transistors MC1-MC3 are N type transistors while a transistor MC4 is a P type transistor. In FIG. 5D, for example, transistors ME1-ME2 are N type transistors while a transistor ME3 is a P type transistor.

Figure 6:
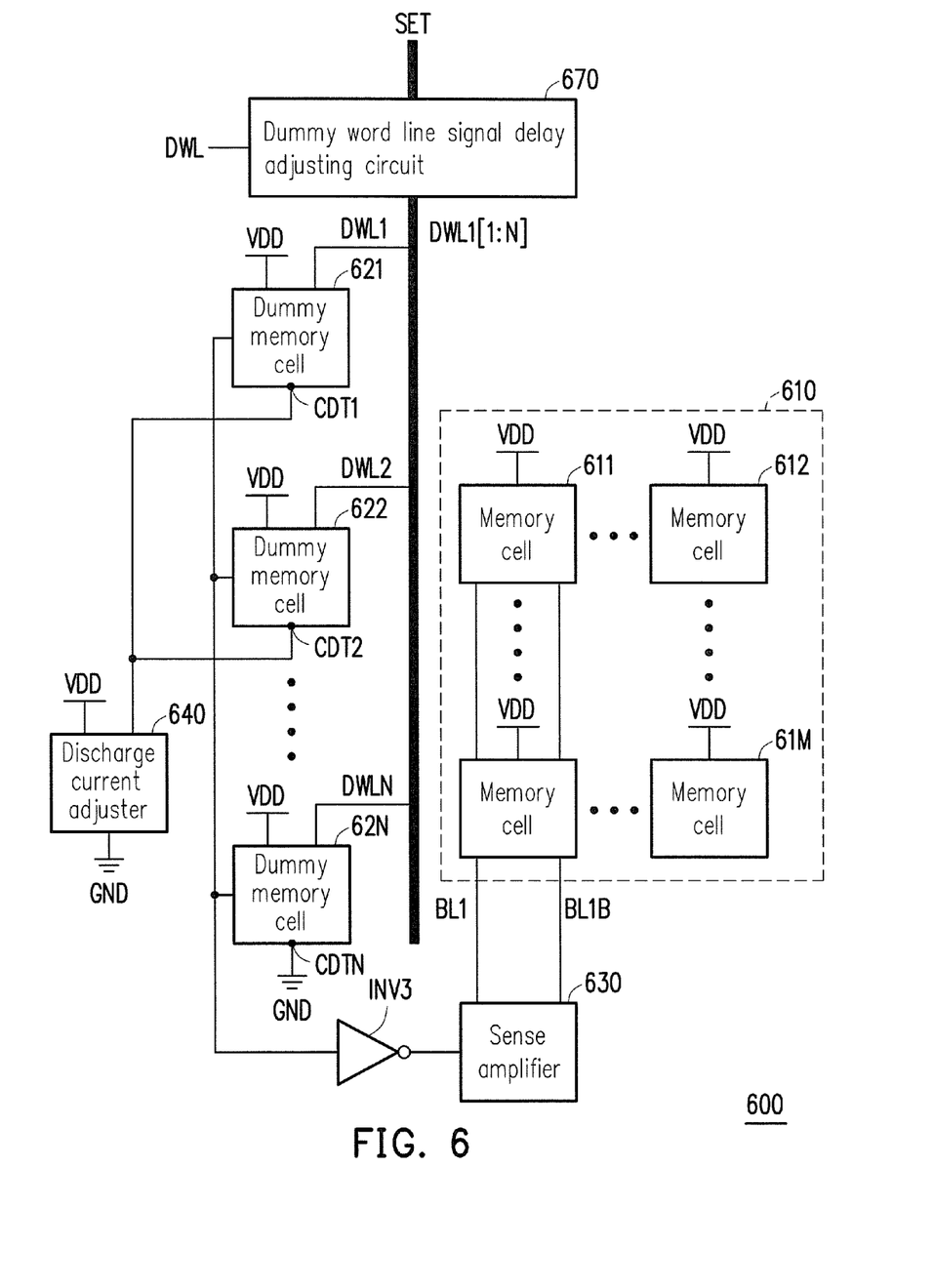
FIG. 6 is a schematic diagram of a static memory apparatus according to another embodiment of the invention.

Next, referring to FIG. 6, FIG. 6 is a schematic diagram of a static memory apparatus according to another embodiment of the invention. A static memory apparatus 600 includes a plurality of memory cells 611-61M, a plurality of dummy memory cells 621-62N, a sense amplifier 630, a discharge current adjuster 640, an inverter INV3, and a dummy word line signal delay adjusting circuit 670. The memory cells 611-61M form a memory array 610. Unlike FIG. 2, the static memory apparatus 600 further performs a delay operation on a dummy word line signal DWL according to a setting signal SET through the dummy word line signal delay adjusting circuit 670, and respectively transmits delayed dummy word line signals DWL1-DWLN to the dummy memory cells 621-62N.

Through the delay operation of the dummy word line signal delay adjusting circuit 670, a pull-down operation of the signal on the dummy bit line DBL is further delayed to prevent the sense amplifier 630 from being enabled too early.

The inverter INV3 is configured to perform an inverting operation on the signal on the dummy bit line DBL, and when the signal on the dummy bit line DBL is pulled down, an output signal generated by the inverter INV3 is pulled up correspondingly, so as to enable the sensing and amplifying operation of the sense amplifier 630.

Figure 7A:
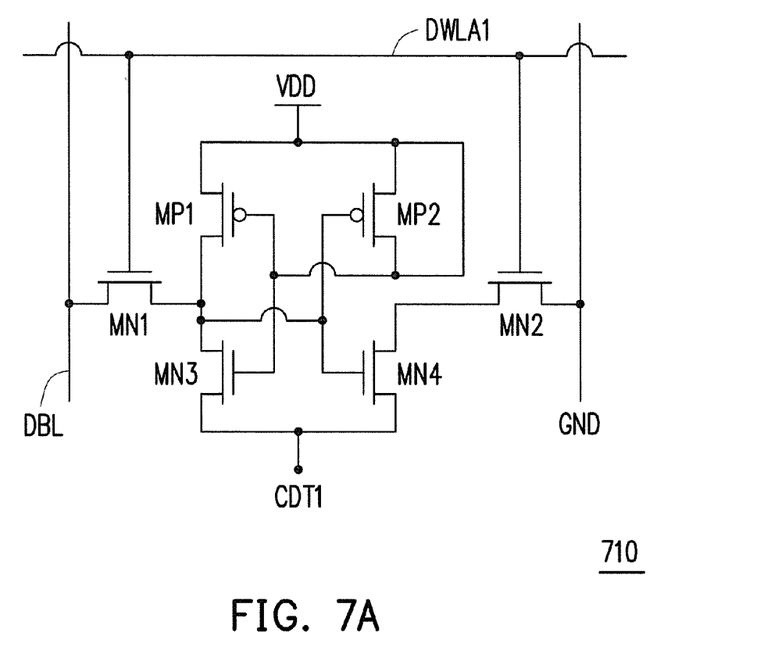
FIG. 7A and FIG. 7B are schematic diagrams respectively illustrating a dummy memory cell according to an embodiment of the invention.
Figure 7B:
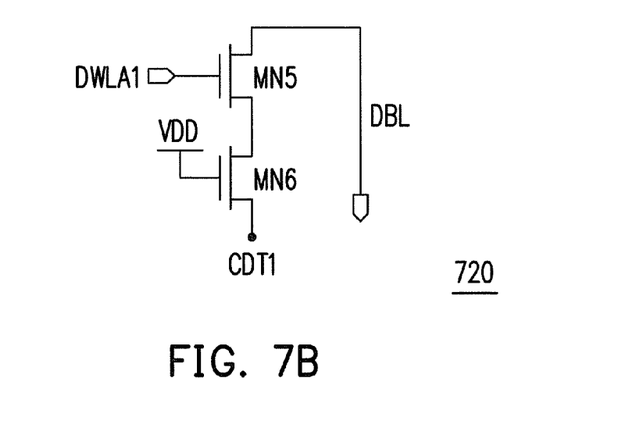

Hereinafter referring to FIG. 7A and FIG. 7B, FIG. 7A and FIG. 7B are schematic diagrams respectively illustrating the dummy memory cells according to an embodiment of the invention. It should be noted that, although this embodiment of the invention exemplifies a 6T memory cell (formed of six transistors), this embodiment also applies to other structures, such as an 8T memory cell (formed of eight transistors). In FIG. 7A, a dummy memory cell 710 includes transistors MN1-MN4 and transistors MP1-MP2. A first end of the transistor MN1 is coupled to the dummy bit line DBL, and a control end of the transistor MN1 is coupled to the dummy word line DWLA1. A first end of the transistor MN2 receives the reference ground voltage GND, and a control end of the transistor MN2 is coupled to the dummy word line DWLA1. A first end of the transistor MP1 receives the operating voltage VDD, and a second end of the transistor MP1 is coupled to a second end of the transistor MN1. A first end and a second end of the transistor MP2 receive the operating voltage VDD and are coupled to a control end of the transistor MP1. A control end of the transistor MP2 is coupled to the second end of the transistor MN1. A first end of the transistor MN3 is coupled to a second end of the transistor MP1, a second end of the transistor MN3 is coupled to the discharge end CDT1, and a control end of the transistor MN3 is coupled to the control end of the transistor MP1. A first end of the transistor MN4 is coupled to the second end of the transistor MN2, a second end of the transistor MN4 is coupled to the discharge end CDT1, and a control end of the transistor MN4 is coupled to the control end of the transistor MP2.

In FIG. 7B, a dummy memory cell 720 includes transistors MN5-MN6. A first end of the transistor MN5 is coupled to the dummy bit line DBL, a control end of the transistor MN5 is coupled to the dummy word line DWLA1, a first end of the transistor MN6 is coupled to a second end of the transistor MN5, a control end of the transistor MN6 receives the operating voltage VDD, and a second end of the transistor MN6 is coupled to the discharge end CDT1.

Figure 8:
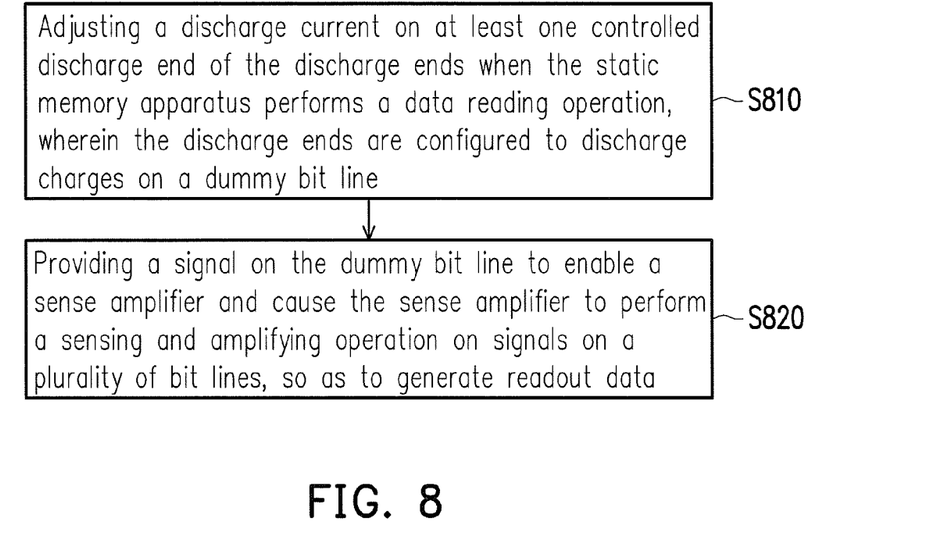
FIG. 8 is a flowchart illustrating a data reading method of the static memory apparatus according to an embodiment of the invention.

Referring to FIG. 8 hereinafter, FIG. 8 is a flowchart illustrating a data reading method of the static memory apparatus according to an embodiment of the invention. The static memory apparatus includes a plurality of dummy memory cells, which respectively include a plurality of discharge ends. Steps of the data reading method include: in Step S810, when the static memory apparatus performs a data reading operation, a discharge current on at least one controlled discharge end of the discharge ends is adjusted, wherein the discharge ends are configured to discharge charges on a dummy bit line; and in Step S820, a signal on the dummy bit line is provided to enable a sense amplifier and cause the sense amplifier to perform a sensing and amplifying operation on signals on a plurality of bit lines, so as to generate readout data.

Details of the steps of the method in this embodiment have been specified in the foregoing embodiments and thus will not be repeated hereinafter.

To conclude the above, when the static memory apparatus receives an operating voltage that has a lower voltage value, the invention adjusts the discharge current on at least one of the discharge ends in the dummy memory cells to delay the variation of the signal on the dummy bit line, such that the sense amplifier is enabled at a proper time point. When the static memory apparatus receives an operating voltage that has a higher voltage value, the variation of the signal on the dummy bit line is not delayed, and therefore, the data reading speed of the static memory apparatus is not slowed down. Moreover, the adjustment of the discharge current can be performed according to the variation of the process voltage temperature, so as to effectively prevent data reading errors caused by the variation of the process voltage temperature.

What is claimed is:

1. A static memory apparatus, comprising:
 a plurality of memory cells arranged to form a memory array coupled to a plurality of bit lines;
 a plurality of dummy memory cells coupled to a dummy bit line and respectively comprising a plurality of discharge ends to discharge charges on the dummy bit line;
 a sense amplifier coupled to the bit lines and the dummy bit line and performing a sensing and amplifying operation on signals on the bit lines according to a signal on the dummy bit line to generate readout data; and
 a discharge current adjuster coupled to at least one controlled discharge end of the discharge ends and adjusting a discharge current on the at least one controlled discharge end according to an operating voltage received by the memory cells.

2. The static memory apparatus according to claim 1, wherein the discharge ends not coupled to the discharge current adjuster are coupled to a reference ground voltage.

3. The static memory apparatus according to claim 1, wherein the discharge current adjuster comprises:
 a variable resistor coupled between the at least one controlled discharge end and a reference ground voltage, wherein a resistance value of the variable resistor varies according to a variation of a bias voltage; and
 a bias voltage adjuster coupled to the variable resistor and providing the bias voltage, wherein the bias voltage adjuster divides the operating voltage to generate the bias voltage according to a bias voltage adjusting signal.

4. The static memory apparatus according to claim 3, wherein the bias voltage adjuster comprises a voltage dividing circuit, wherein the voltage dividing circuit divides the operating voltage to generate the bias voltage when the bias voltage adjusting signal indicates that an adjusting operation of the bias voltage is enabled.

5. The static memory apparatus according to claim 4, wherein the bias voltage adjuster further comprises a pull-up circuit, wherein the pull-up circuit causes the bias voltage to be pulled up to be equal to the operating voltage when the bias voltage adjusting signal indicates that the adjusting operation of the bias voltage is turned off.

6. The static memory apparatus according to claim 5, wherein the pull-up circuit is a transistor that comprises a first end, a second end, and a control end, wherein the first end of the transistor receives the operating voltage, the control end of the transistor receives the bias voltage adjusting signal, and the second end of the transistor generates the bias voltage.

7. The static memory apparatus according to claim 4, wherein the bias voltage adjuster further comprises:
 an inverter receiving the bias voltage adjusting signal to generate an inverted bias voltage adjusting signal;
 a first switch connected in series in a path of the voltage dividing circuit receiving the operating voltage to be turned on or off according to the inverted bias voltage adjusting signal; and
 a second switch connected in series to a path of the voltage dividing circuit coupled to the reference ground voltage to be turned on or off according to the bias voltage adjusting signal.

8. The static memory apparatus according to claim 4, wherein the voltage dividing circuit comprises:
 a plurality of diodes connected in series between the operating voltage and the reference ground voltage in a forward bias direction, wherein N mutual connection ends are disposed between the diodes, and one of the N mutual connection ends provides the bias voltage.

9. The static memory apparatus according to claim 3, wherein the variable resistor comprises:
 a transistor comprising a first end, a second end, and a control end, wherein the first end of the transistor is coupled to the controlled discharge end, the second end of the transistor is coupled to the reference ground voltage, and the control end of the transistor receives the bias voltage.

10. The static memory apparatus according to claim 1, further comprising:
 a dummy word line signal delay adjusting circuit receiving a setting signal to delay a plurality of dummy word line signals, wherein the dummy word line signals are respectively transmitted to the dummy memory cells.

11. The static memory apparatus according to claim 1, wherein each of the dummy memory cells comprises:
 a first transistor comprising a first end, a second end, and a control end, wherein the first end of the first transistor is coupled to the dummy bit line and the control end of the first transistor is coupled to a dummy word line;
 a second transistor comprising a first end, a second end, and a control end, wherein the first end of the second transistor receives the reference ground voltage and the control end of the second transistor is coupled to the dummy word line;
 a third transistor comprising a first end, a second end, and a control end, wherein the first end of the third transistor receives the operating voltage and the second end of the third transistor is coupled to the second end of the first transistor;
 a fourth transistor comprising a first end, a second end, and a control end, wherein the first end and the second end of the fourth transistor receive the operating voltage and are coupled to the control end of the third transistor, and the control end of the fourth transistor is coupled to the second end of the first transistor;
 a fifth transistor comprising a first end, a second end, and a control end, wherein the first end of the fifth transistor is coupled to the second end of the third transistor, the second end of the fifth transistor is coupled to the discharge ends of each of the dummy memory cells, and the control end of the fifth transistor is coupled to the control end of the third transistor; and
 a sixth transistor comprising a first end, a second end, and a control end, wherein the first end of the sixth transistor is coupled to the second end of the second transistor, the second end of the sixth transistor is coupled to the discharge ends of each of the dummy memory cells, and the control end of the sixth transistor is coupled to the control end of the fourth transistor.

12. The static memory apparatus according to claim 1, wherein each of the dummy memory cells comprises:
 a first transistor comprising a first end, a second end, and a control end, wherein the first end of the first transistor is coupled to the dummy bit line and the control end of the first transistor is coupled to a dummy word line; and
 a second transistor comprising a first end, a second end, and a control end, wherein the first end of the second transistor is coupled to the second end of the first transistor, the control end of the second transistor receives the operating voltage, and the second end of the second transistor is coupled to the discharge ends of each of the dummy memory cells.

13. A data reading method of a static memory apparatus comprising a plurality of dummy memory cells which respectively comprise a plurality of discharge ends, the data reading method comprising:

adjusting a discharge current on at least one controlled discharge end of the discharge ends when the static memory apparatus performs a data reading operation, wherein the discharge ends discharge charges on a dummy bit line; and providing a signal on the dummy bit line to enable a sense amplifier and cause the sense amplifier to perform a sensing and amplifying operation on a signal on a plurality of bit lines to generate readout data.

14. The data reading method according to claim 13, wherein the step of adjusting the discharge current on the at least one controlled discharge end of the discharge ends when the static memory apparatus performs the data reading operation comprises:

generating a bias voltage when the static memory apparatus performs the data reading operation; and adjusting a resistance value between the at least one controlled discharge end and a reference ground voltage according to the bias voltage.

15. The data reading method according to claim 14, wherein the bias voltage is obtained by dividing an operating voltage received by the static memory apparatus.

\* \* \* \* \*